United States Patent
Yang

(10) Patent No.: US 8,049,112 B2
(45) Date of Patent: *Nov. 1, 2011

(54) FLEXIBLE CIRCUIT WITH COVER LAYER

(75) Inventor: Rui Yang, Austin, TX (US)

(73) Assignee: 3M Innovative Properties Company, St. Paul, MN (US)

( * ) Notice: Subject to any disclaimer, the term of this patent is extended or adjusted under 35 U.S.C. 154(b) by 1174 days.

This patent is subject to a terminal disclaimer.

(21) Appl. No.: 11/735,167

(22) Filed: Apr. 13, 2007

(65) Prior Publication Data

US 2008/0254392 A1 Oct. 16, 2008

(51) Int. Cl.
*H05K 1/00* (2006.01)

(52) U.S. Cl. ........ 174/254; 174/258; 174/259; 428/209; 428/458; 428/473.5; 361/749; 361/750; 361/751

(58) Field of Classification Search .......... 428/209, 428/458, 473.5; 361/749, 750, 751; 174/254, 174/258, 259

See application file for complete search history.

(56) References Cited

U.S. PATENT DOCUMENTS

| | | | |
|---|---|---|---|
| 3,448,098 A | 6/1969 | Gaines et al. | |
| 3,469,982 A | 9/1969 | Celeste | |
| 3,526,504 A | 9/1970 | Celeste | |
| 3,867,153 A | 2/1975 | MacLachlan | |
| 4,634,631 A | 1/1987 | Gazit et al. | |
| 4,647,508 A | 3/1987 | Gazit et al. | |
| 4,847,353 A | 7/1989 | Watanabe | |
| 4,937,133 A | 6/1990 | Watanabe et al. | |
| 4,939,039 A | 7/1990 | Watanabe | |
| 6,218,022 B1 | 4/2001 | Suzuki et al. | |
| 6,372,992 B1 | 4/2002 | Yang | |
| 7,348,045 B2 | 3/2008 | Yang et al. | |
| 7,348,064 B2 | 3/2008 | Kanakarajan | |
| 2003/0153476 A1 | 8/2003 | Akita et al. | |
| 2005/0186404 A1 | 8/2005 | Mao et al. | |

FOREIGN PATENT DOCUMENTS

| | | |
|---|---|---|
| EP | 0832918 | 4/1997 |
| JP | 05-183260 | 7/1993 |
| WO | WO 03/043945 | 5/2003 |

OTHER PUBLICATIONS

U.S. Appl. No. 11/288,914 entitled "Polymer Etchant and Method of Using Same"; Guoping Mao, Rui Yang, Lizhang Yang, filed Nov. 28, 2005.

"The Technology of Photoresist Stripping", Rudy Sedlak, RD Chemical Company, updated Dec. 9, 1999, [retrieved from the Internet on Feb. 20, 2007], URL <www.pcbfab.com/strppng.html>.

Product Literature: Holders Technology UK Ltd., "Espanex™ Adhesiveless Polyimide Laminate and Coverlay", Mar. 2005, 4 pgs.

*Primary Examiner* — Cathy Lam

(74) *Attorney, Agent, or Firm* — Melanie G. Gover

(57) ABSTRACT

The invention relates to flexible circuits and more particularly to flexible printed circuits having cover layers. The cover layers may be a chemically-etchable adhesive polyimide. The cover layers may be patterned after they are applied to the flexible circuit substrate.

29 Claims, 3 Drawing Sheets

FLEXIBLE CIRCUIT WITH COVER LAYER

FIELD

The invention relates to flexible printed circuits and more particularly to flexible printed circuits having cover layers.

BACKGROUND

Flexible circuits typically consist of a polymer substrate and patterned conductive layer on the polymer substrate. Some flexible circuits additionally have protective cover layers. The cover layers are typically pre-patterned polymer films that are placed over the patterned conductive layer and adhered to the polymer substrate layer. The cover layers are patterned so that only portions of the conductive layer are exposed. Adequate application of these cover layers requires precise registration of the cover layer to the flexible circuit as it is applied. If misregistration occurs, an incorrect portion of the conductive layer will be exposed, potentially rendering the flexible circuit defective or useless.

SUMMARY

At least one aspect of the present invention provides the ability to make a flexible circuit with a cover layer without having to register the cover layer to the flexible circuit.

At least one aspect of the present invention provides a flexible circuit in which the circuit layer is hermetically sealed between the substrate and cover layer.

At least one aspect of the present invention provides a method for applying a cover layer to a flexible circuit and subsequently patterning the cover layer to expose portions of the circuit.

The articles of the present invention may have a number of different structures. At least one structure includes a substrate layer, a patterned conductive layer, and a cover layer. The substrate and cover layer may be made of the same or different polymeric material. The cover layer material conforms to the shape of the patterned conductive layer and bonds to the substrate layer. Suitable polymeric materials for the substrate include adhesive polyimides, liquid crystal polymers, polycarbonates, and thermoset polyimides including thermoset polyimide copolymers having carboxylic ester units in the polymeric backbone. Suitable materials for the cover layer include adhesive polyimides.

Secondary substrates and secondary cover layers may also be included in the structure. This is most typical when the substrate and/or cover layer is an adhesive polyimide. Suitable materials for secondary substrates and secondary cover layers include liquid crystal polymers, polycarbonates, and thermoset polyimides including thermoset polyimide copolymers having carboxylic ester units in the polymeric backbone.

Unless otherwise stated, concentrations of components are presented herein in terms of wt %.

DETAILED DESCRIPTION

Figure 1A:
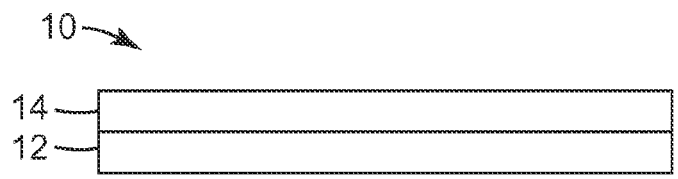
FIGS. 1A-1E illustrate a process for making an article according to one embodiment of the present invention.

As required, details of the present invention are disclosed herein; however, it is to be understood that the disclosed embodiments are merely exemplary. Therefore, specific structural and functional details disclosed herein are not to be interpreted as limiting, but merely as a basis for the claims and as a representative basis for teaching one skilled in the art to variously employ the present invention.

At least one aspect of the present invention provides a method of making a flexible circuit with a cover layer without having to pre-pattern the cover layer and register it to the flexible circuit during application. According to this aspect of the invention, an unpatterned cover layer may be bonded to the flexible circuit, i.e., bonded to a substrate having a patterned circuit on its surface, such that the patterned circuit is between the substrate and cover layer, thereby forming a "covered flexible circuit." The cover layer may be bonded to the flexible circuit by applying heat and/or pressure. Subsequently, the cover layer may be patterned, preferably by chemical etching. The cover layer may be patterned before, after, or preferably at the same time as any patterning of the substrate layer. Preferably the substrate and cover layer are made of materials having compatible etch rates for a particular etchant so they may be etched at the same time.

The cover layers and substrate layers of the present invention may comprise adhesive polyimides. Although some thermoset polyimides have been know to be etchable by various etchant solutions, thermoplastic polyimides, such as adhesive polyimides, have not been suitable for chemical etching, and therefore were not suitable for use as etchable flexible circuit cover layers. Through extensive and diligent research, the inventor found adhesive polyimides that can be chemically etched. Furthermore, the inventor found adhesive polyimides that can be etched with the same etchant solutions used for LCPs, polycarbonates, and thermoset polyimides, and in some cases at the same or a similar etch rate.

Particularly suitable adhesive polyimides include polyamide-imides having the following repeat units.

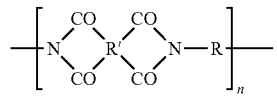

in which R represents a divalent radical, R' represents a trivalent radical, and n is an integer of at least 5. In some embodiments, one or both of the primary substrate and primary cover layer comprise an adhesive polyimide having these repeating units:

In some embodiments, R is

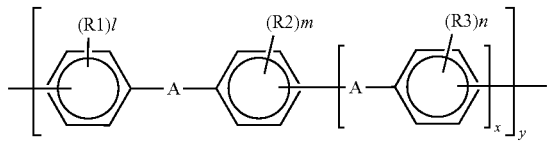

and A is —NH—CO—, R1 to R3 are alkyl, alkoxy, or halogen, either identical with or different from one another, l, m, and n are integers from 0 to 4, x is 0 or 1, and y is an integer indicating the number of repeating units and is equal to or greater than 1 and in which at least one alkoxy group is present.

In other embodiments R is

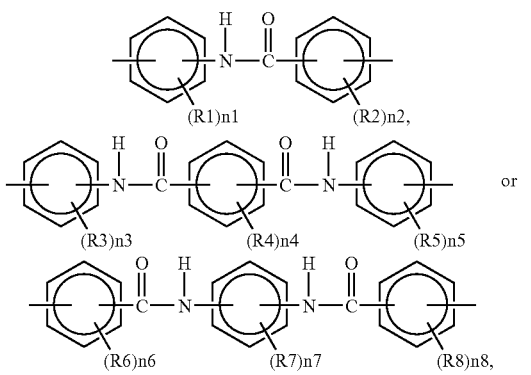

wherein R1 to R8 are independently of one another lower alkyl groups, lower alkoxy groups, or halogens, and n1 to n8 are integers of 0 to 4.

In some embodiments R' is

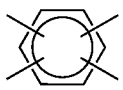

These adhesive polyamide-imides, and suitable variations thereof, are disclosed in U.S. Pat. Nos. 4,847,353; 4,937,133; and 4,939,039, which are incorporated by reference in their entirety. Adhesive polyamide-imides are available under the trade designation ESPANEX from Nippon Steel Chemical Co., Ltd., Tokyo, Japan.

If a covered flexible circuit is made having an adhesive polyimide cover layer or an adhesive polyimide substrate layer without an adjacent secondary (non-adhesive) cover or substrate layer, the adhesive layer may be adhered to a release liner during processing to prevent the adhesive polyimide from adhering to processing equipment. Alternatively, the processing equipment may be treated with a release material to prevent adhesion of the adhesive polyimide.

In some embodiments of the present invention, the cover layer is an adhesive polyimide while the substrate is a non-adhesive material. In such an embodiment, no secondary substrate is needed, but a secondary cover layer may be desirable.

Examples of suitable materials for a non-adhesive substrate layer or a secondary cover layer or secondary substrate layer include thermoset polyimides, polycarbonates, and liquid crystal polymers (LCP).

Thermoset polyimides have excellent properties such as thermal stability and low dielectric constant. Many commercially available thermoset polyimides suitable for use in the present invention comprise monomers of pyromellitic dianhydride (PMDA), or oxydianiline (ODA), or biphenyl dianhydride (BPDA), or phenylene diamine (PPD). Thermoset polyimide polymers including one or more of these monomers may be used to produce film products designated as KAPTON H, K, E films (available from E. I. du Pont de Nemours and Company, Circleville, Ohio) and APICAL AV, NP films (available from Kaneka Corporation, Otsu, Japan). Films of this type are suitable for many flexible circuit products, but may swell in the presence of conventional chemical etchants, such as alkaline etchants. Swelling changes the thickness of the film and may cause localized delamination of resist. This can lead to loss of control of etched film thickness and irregular shaped features due to etchant migration into the delaminated areas. If swelling is an issue in the making of a particular flexible circuit, non-swelling materials should be used.

In contrast to the above-described thermoset polyimides, other thermoset polyimides suitable for use in the present invention are those having carboxylic ester structural units in the polymeric backbone. These thermoset polyimides will not swell in the presence of conventional chemical etchants. Examples of thermoset polyimides having carboxylic ester structural units in the polymeric backbone include those available under the trade designation APICAL HPNF films (available from Kaneka Corporation, Otsu, Japan). APICAL HPNF polyimide film is believed to be a copolymer that derives its ester unit containing structure from polymerizing of monomers including p-phenylene bis(trimellitic acid mono ester anhydride). Other ester unit-containing thermoset polyimide polymers may not be known commercially. However, to one of ordinary skill in the art, it would be reasonable to synthesize other ester-unit containing thermoset polyimide polymers depending upon selection of monomers similar to those used for APICAL HPNF. Such syntheses could expand the range of non-swelling thermoset polyimide polymers. Materials that may be selected to increase the number of ester-containing thermoset polyimide polymers include 1,3-diphenol bis(anhydro-trimellitate), 1,4-diphenol bis(anhydro-trimellitate), ethylene glycol bis(anhydro-trimellitate), biphenol bis(anhydro-trimellitate), oxy-diphenol bis(anhydro-trimellitate), bis(4-hydroxyphenyl sulfide) bis(anhydro-trimellitate), bis(4-hydroxybenzophenone) bis(anhydro-trimellitate), bis(4-hydroxyphenyl sulfone) bis(anhydro-trimellitate), bis(hydroxyphenoxybenzene), bis(anhydro-trimellitate), 1,3-diphenol bis(aminobenzoate), 1,4-diphenol bis(aminobenzoate), ethylene glycol bis(aminobenzoate), biphenol bis(aminobenzoate), oxy-diphenol bis(aminobenzoate), bis(4 aminobenzoate) bis(aminobenzoate), and the like.

Liquid crystal polymers (LCPs) have improved high frequency performance, lower dielectric loss, and less moisture absorption compared to polyimides. Liquid crystal polymers, which exhibit the same non-swelling property as some of the above-described thermoset polyimides, comprise aromatic polyesters including copolymers containing p-phenyleneterephthalamide, such as those available under the trade designation BIAC (available from Japan Gore-Tex Inc., Okayama-Ken, Japan); and copolymers containing p-hydroxybenzoic acid, such as those available under the trade designation LCP CT film (available from Kuraray Co., Ltd., Okayama, Japan); and LCP films such as those available under the trade designation R/FLEX from Rogers, Chandler, Ariz. A similarity between liquid crystal polymers and APICAL HPNF polyimide is the presence of carboxylic ester units in both types of polymer structures.

Characteristics of polycarbonates include electrical insulation, moisture absorption less than 0.5% at saturation, a dielectric constant not to exceed 3.5 over the functional frequency range of 1 kHz to 45 GHz, better chemical resistance and lower modulus when compared to polyimide, and optical clarity. Examples of suitable polycarbonates include substituted and unsubstituted polycarbonates, polycarbonate blends such as polycarbonate/aliphatic polyester blends, including the blends available under the tradename XYLEX from GE Plastics, Pittsfield, Mass., polycarbonate/polyethyleneterephthalate (PC/PET) blends, polycarbonate/polybutyleneterephthalate (PC/PBT) blends, and polycarbonate/poly(ethylene 2,6-naphthalate) (PC/PEN) blends, and any other blend of polycarbonate with a thermoplastic resin; and polycarbonate copolymers such as polycarbonate/polyethyleneterephthalate (PC/PET), polycarbonate/polyetherimide (PC/PEI), and the like. Another type of material suitable for use in the present invention is a polycarbonate laminate. Such a laminate may have at least two different polycarbonate layers adjacent to each other or may have at least one polycarbonate layer adjacent to a thermoplastic material layer (e.g., LEXAN GS125DL which is a polycarbonate/polyvinyl fluoride laminate from GE Plastics). Polycarbonate materials may also be filled with carbon black, silica, alumina and the like or they may contain additives such as flame retardants, UV stabilizers, pigment and the like.

An exemplary process for making a flexible circuit according to the present invention may include etching the cover layer and any secondary cover layer on the flexible circuit. The substrate and any secondary substrate may also be etched. The etching step of the process involves contacting unmasked areas of these polymeric layers with a concentrated aqueous alkaline etching solution comprising a water soluble alkali metal salt, an amine, and an alcohol.

Water soluble alkali metal salts suitable for use in etchant solutions according to the present invention include, for example, alkali metal hydroxides such as potassium hydroxide (KOH), sodium hydroxide (NaOH), substituted ammonium hydroxides, such as tetramethylammonium hydroxide and ammonium hydroxide or mixtures thereof. Useful concentrations of the salts in the etchant solution vary depending upon the thickness of the polymer film to be etched, as well as the type and thickness of the mask chosen such as a metal mask or a photoresist. Typical useful concentrations of a suitable alkali metal salt have a lower range of about 30 wt % in at least one embodiment and about 35 wt % in at least another embodiment. Typical useful concentrations of a suitable alkali metal salt have an upper range of about 50 wt % in at least one embodiment, and about 55 wt % in at least another embodiment. At least one embodiment has an alkali metal salt concentration of about 40 wt % to about 45 wt %.

Amines suitable for use in etchant solutions according to the present invention include ethylene diamine and propylene diamine, and alkanolamines such as ethanolamine, monoethanolamine (MEA), diethanolamine, propanolamine, and the like. Typical useful concentrations of a suitable amine have a lower range of about 10 wt % in at least one embodiment and about 15 wt % in at least another embodiment. Typical useful concentrations of a suitable amine have an upper range of about to 30 wt % in at least one embodiment, and about 35 wt % in at least another embodiment. At least one embodiment has an amine concentration of about 20 wt % to about 25 wt %.

Alkali metal salt/amine etchants, such as KOH/MEA etchants, have limited solubility in water at low temperatures, e.g., room temperature. At concentrations suitable for etching the substrate and cover layers (including secondary substrate and cover layers) of the present invention, a KOH/MEA solution will typically solidify due to KOH crystallization. To prevent solidification, the solution can be maintained at elevated temperatures, e.g., 80° C. and above. However, it was found that elevated temperatures quickly degraded the etching ability of the solution. This is believed to be due to the absorption of carbonate from the air, which bonds with the potassium to form potassium carbonate. The inventor found that adding an alcohol, such as ethylene glycol, to the solution helped to reduce carbonate absorption and prevent KOH crystallization. Accordingly, an alcohol, such as a glycol, preferably ethylene glycol, or a ketone, such as methylethyl ketone (MEK), methyl isobutyl ketone (MIBK), is also added to the etchant solution to increase its stability and performance. Typical useful concentrations of a suitable alcohol have a lower range of about 3 wt % in at least one embodiment and about 5 wt % in at least one other embodiment and an upper range of about to 10 wt. % in at least one embodiment and about 30 wt % in at least one other embodiment. In at least one embodiment, a suitable concentration is about 7 wt %.

In at least one embodiment, a suitable aqueous etchant solution comprises about 30 to about 50 wt % alkali metal salt, about 10 to about 30 wt % amine, and about 5 to about 10 wt % alcohol. In another embodiment a suitable aqueous etchant solution comprises about 40 wt % alkali metal salt, about 20 wt % amine, and about 7 wt % alcohol. In some embodiment, the alkali metal salt is KOH, the amine is MEA, and the alcohol is ethylene glycol.

The etching solution is typically maintained at a temperature of about 50° C. to about 120° C. preferably about 70° C. to about 95° C. during etching. Time requirements for etching a polymeric film depends on the type and thickness of the polymeric film. Film etching, using an alkaline etchant heated between 50° C. and 120° C. typically requires about 10 seconds to about 20 minutes.

Any type of aqueous photoresist is suitable for use in the present invention. The resists may be positive or negative. Examples of suitable negative photoresists include negative acting, aqueous developable, photopolymer compositions such as those disclosed in U.S. Pat. Nos. 3,469,982; 3,448,098; 3,867,153; and 3,526,504. Such photoresists include at least a polymer matrix including crosslinkable monomers and a photoinitiator. Polymers typically used in photoresists include copolymers of methyl methacrylate, ethyl acrylate and acrylic acid, copolymers of styrene and maleic anhydride isobutyl ester and the like. Crosslinkable monomers may be multiacrylates such as trimethylol propane triacrylate.

Commercially available aqueous base, e.g., sodium carbonate developable, negative acting dry film photoresists include those commercially available under the trade designations KG 2150 and ACCUIMAGE from Kolon Industries, Korea. Also suitable are polymethyl-methacrylates photoresist materials such as those available under the trade designation RISTON from E.I. duPont de Nemours and Co., e.g., RISTON 4720. Other useful examples include AP850 available from LeaRonal, Inc., Freeport, N.Y., and PHOTEC HU350 available from Hitachi Chemical Co. Ltd. Dry film photoresist compositions under the tradename AQUA MER are available from MacDermid, Waterbury, Conn. There are several series of AQUA MER photoresists including the "SF" and "CF" series with SF120, SF125, and CF2.0 being representative of these materials. A metal mask may be used in the place of the photoresist.

Flexible circuit fabrication comprising the etching procedures described above may be done in conjunction with various pre-etching and post-etching procedures. The sequence and type of process steps is application dependent. A typical process begins with a substrate layer comprising a polymer film having a thin conductive layer laminated thereto. The substrate layer may comprise only an adhesive polyimide (optionally with a release layer); may comprise only a non-adhesive substrate layer such as LCP, polycarbonate, or thermoset polyimide; or may comprise a laminate of an adhesive polyimide substrate layer and a secondary substrate layer material such as LCP, polycarbonate, or thermoset polyimide. Alternatively, if the substrate layer is an adhesive polyimide, a secondary substrate layer may be subsequently applied.

The conductive layer may be laminated to the substrate layer. Alternatively, the thin conductive layer may be deposited onto a surface of the substrate layer using sputtering, plating, other known deposition techniques, or a combination thereof. The conductive layer may be any suitable material such as copper, gold, aluminum, etc. It may have a tie layer made of a suitable material such as Ni, Cr, or NiCr. Typically, the conductive layer is copper. Copper will be used as an exemplary conductive material in the following process descriptions.

In a typical semi-additive process, the substrate comprises a polymeric film layer of about 12 µm to about 300 µm, with the copper layer being about 1 to about 5 µm thick. Aqueous processable photoresist material is applied to the copper layer using standard techniques. The thickness of the photoresist is about 5 µm to about 50 µm. Upon imagewise exposure of the photoresist to ultraviolet light or the like, through a mask, the exposed portions of the photoresist become insoluble by crosslinking. The resist is then developed by removal of unexposed photoresist with a dilute aqueous solution, e.g., a 0.5-1.5% sodium carbonate solution, until the desired photoresist pattern is obtained on the copper layer. The copper layer is then further plated to a desired thickness. A dilute aqueous solution, containing from 2% to 5% alkali metal carbonate, may be used at temperatures of about 20° C. to about 80° C., preferably about 20° C. to about 60° C., to strip the crosslinked resist from the copper layer, after which the copper circuit traces may be formed by using a copper specific etchant, such as PERMA ETCH, available from Electrochemicals, Inc., to remove the copper between the desired trace pattern, thereby exposing portions of the underlying polymeric substrate.

In an alternate subtractive process, an aqueous processable photoresist is also applied onto the copper layer on the polymeric substrate, using standard techniques. The substrate is typically about 12 µm to about 300 µm thick with the copper layer being about 5 µm to about 40 µm thick. The photoresist is then exposed to ultraviolet light or the like, through a suitable mask, crosslinking the exposed portions of the resist. The resist is then developed with a dilute aqueous solution until the desired photoresist pattern is obtained on the copper layer. The exposed portion of the copper layer is then etched down to the polymeric layer to obtain the desired trace pattern.

Subsequently, in both exemplary processes, a cover layer material is applied and bonded to the substrate over the patterned conductive copper layer to form a laminate comprised of a polymer substrate layer, a conductive circuit layer, and a polymer cover layer. The cover layer may be applied as a liquid that is flood coated over the circuit and cured or it may be applied as a film that is laminated to the substrate and conductive layer using heat and pressure. The cover layer may comprise only an adhesive polyimide (optionally with a release layer) or it may comprise a laminate of an adhesive polyimide and a secondary cover layer material such as LCP, polycarbonate, or thermoset polyimide. Alternatively, an adhesive polyimide cover layer and a secondary cover layer may be applied in sequence.

Once the cover layer (including any secondary cover layer) is bonded to the substrate layer (including any secondary substrate layer), aqueous processable photoresist material is applied to both sides of the laminate. One or both of the photoresist layers are patterned in a manner similar to that described above for etching the conductive copper layer. Depending on the desired end product, one or both of the substrate and cover layers will be etched to expose at least a portion of the conductive layer. If both the substrate and cover layers will be etched, but in separate steps, it may be desirable to pattern only the photoresist on the side to be etched at this time.

The process continues with exposure of the laminate to a concentrated alkaline etchant solution, either by immersion in a bath or by spraying, typically at a temperature between 50° C. and 120° C. This etches the polymer areas not covered by crosslinked resist. The residence time in the etchant bath to etch through the polymer layer down to the copper circuit layer is typically from about 10 seconds to about 20 minutes. The crosslinked resist is then stripped from both sides of the laminate in the same manner as described above for the copper layer. If only one polymer layer (e.g., the cover or substrate layer) was etched, the process of applying and patterning photoresist and etching a polymer layer may be repeated for the other polymer layer. However, an advantage of the present invention is that the substrate and cover layers (primary and secondary) may be simultaneously etched by the same etchant solution. The inventor found that the adhesive polyimides could be etched using the same etchant solutions being used to etch LCPs, polycarbonates, and thermoset polyimides. This allows for a more efficient and speedy etching process. If desired, additional processing may be employed to add multiple layers and to plate exposed areas of the conductive layer with, e.g., gold, tin, chrome, nickel, or the like.

Figure 1B:
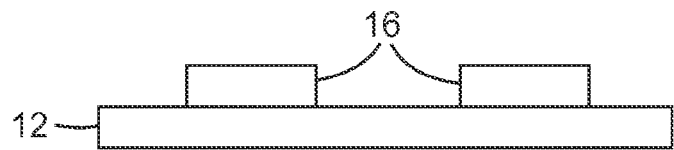
Figure 1C:
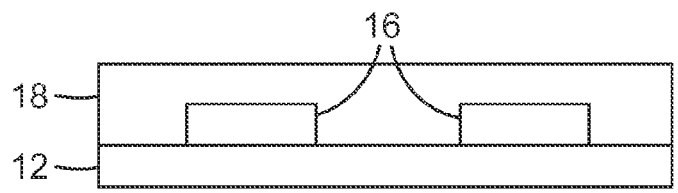
Figure 1D:
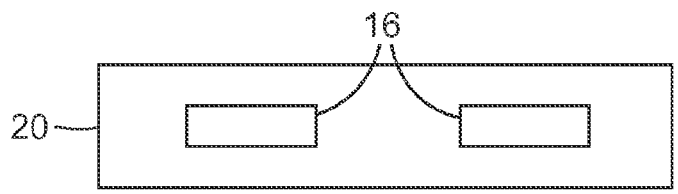
Figure 1E:
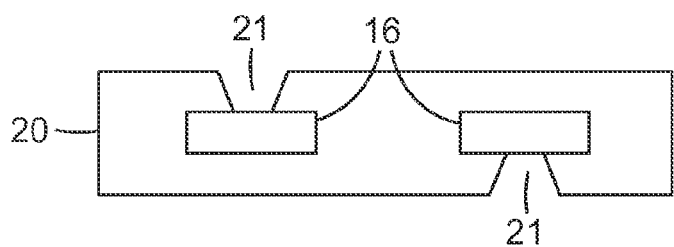

In one embodiment of the present invention, a flexible circuit having a cover layer and a substrate layer is made. The process of making such a flexible circuit is illustrated in FIGS. 1A-1E. FIG. 1A shows the starting material, which is a laminate (10) having a substrate layer (12) and a conductive layer (14). The substrate layer may be an adhesive polyimide. Photoresist is then applied to the conductive layer and exposed to UV light through a patterning mask. After the photoresist is developed, the exposed portion of the copper is etched away to form the desired patterned circuit (16). Then the patterned photoresist is stripped to produce the structure illustrated in FIG. 1B. Cover layer (18), which may also be an adhesive polyimide is applied over patterned circuit (16). The cover layer is then bonded to substrate (12) and patterned circuit (16), e.g., with a laminator, so that the cover layer and substrate layer bond together to form bonded layer (20). Any type of bonding process may be used as long as the cover and substrate layers bond to each other, preferably forming a hermetic seal around the patterned circuit. The resulting structure is illustrated in FIG. 1D, which includes patterned circuit (16) within bonded layer (20). FIG. 1E illustrates the covered flexible circuit structure after vias (21) have been etched through the cover and substrate layers to expose portions of the patterned circuit (16).

Figure 2A:
FIGS. 2A-2E illustrate a process for making an article according to another embodiment of the present invention.
Figure 2B:
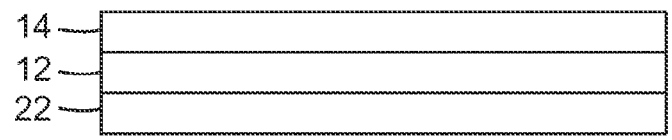
Figure 2C:
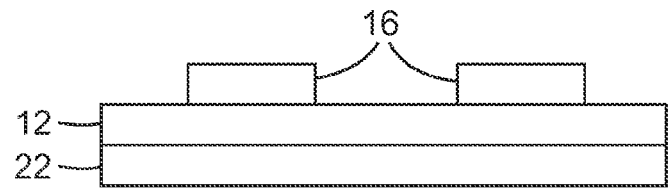
Figure 2D:
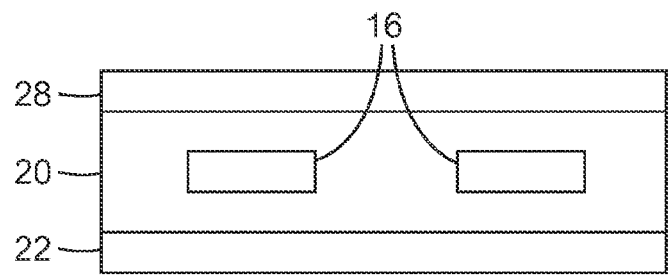
Figure 2E:
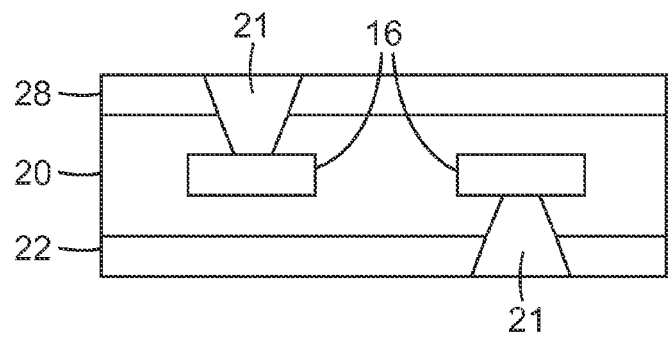

In an alternative embodiment of the present invention, a flexible circuit having a secondary cover layer and a secondary substrate layer is made. The process of making such a flexible circuit is illustrated in FIGS. 2A-2E. FIG. 2A shows the starting material, a first laminate having a substrate layer (12) and a secondary substrate layer (22). The substrate layer is an adhesive polyimide and the secondary substrate layer may be LCP, polycarbonate, or thermoset polyimide. As illustrated in FIG. 1B, a layer of conductive material (14), such as copper, is applied to the substrate layer. Photoresist is then applied to the copper layer and exposed to UV light through a patterning mask. After the photoresist is developed, the exposed portion of the copper is etched away to form the desired patterned circuit (16). Then the patterned photoresist is stripped to produce the structure illustrated in FIG. 1C. A second laminate having a cover layer and a secondary cover layer (not shown independently) is applied, cover layer side down, over patterned circuit (16). The cover layer is an adhesive polyimide and the secondary cover layer may be LCP, polycarbonate, or thermoset polyimide. The second laminate may then be bonded to the first laminate, e.g., with a laminator, so that the cover layer and substrate layer of the two laminates bond together to form bonded layer (20) surrounding patterned circuit (16). Any type of bonding process may be used as long as the cover and substrate layers bond to each other, preferably forming a hermetic seal around the patterned circuit. The resulting structure is illustrated in FIG. 1D, which includes secondary substrate layer (22) patterned circuit (16) within bonded layer (20) and secondary cover layer (28). FIG. 1E illustrates the structure after vias (21) have been etched through the cover and secondary cover layers, and the substrate and secondary substrate layers, respectively, to expose portions of the patterned circuit (16). The polymers may be etched in the same manner as previously described.

Additional steps may be needed to etch the cover layer and substrate layer exposed by the removal of portions of the secondary cover and secondary substrate layer(s) if the cover and substrate layers require a different etchant solution than the secondary cover and secondary substrate layer(s). As mentioned, an advantage of many embodiments of the present invention is that the cover and substrate layers can be etched by the same etchant as the secondary cover and secondary substrate layer(s), thereby allowing them to be etched in the same step as their adjacent secondary layer. If only a portion of the exposed areas of the cover and/or substrate layers are to be etched, a new or additional layer of photoresist can be applied over those portions that are not to be etched.

Figure 3:
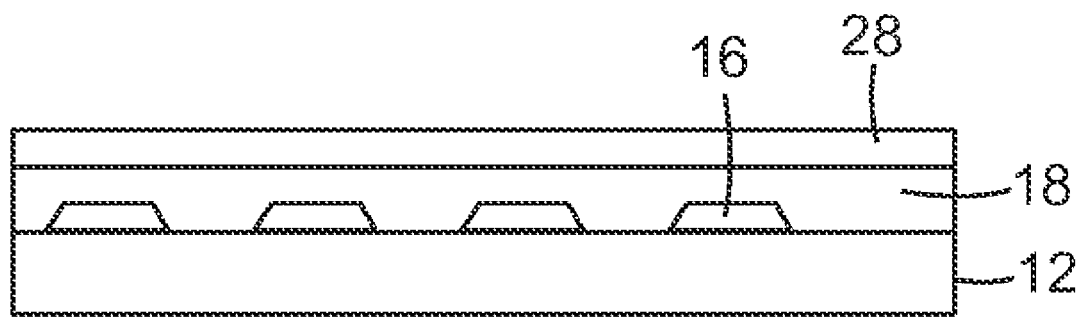
FIG. 3 illustrates a cross-section of an article according to yet another embodiment of the present invention.

An alternative embodiment is illustrated in FIG. 3, shows, from bottom to top, substrate (12), patterned circuit (16), cover layer (18), and secondary cover layer (28). Making this covered flexible circuit structure typically starts with a substrate having a thin conductive layer laminated thereto. In this embodiment, the substrate is typically LCP, polycarbonate, or thermoset polyimide. The patterned circuit may be formed by any known method such as the semi-additive or subtractive methods described above. Subsequently, a laminate comprising a cover layer and secondary cover layer is applied to the substrate and patterned circuit. Alternatively, the cover and secondary cover layers may be applied sequentially. In this embodiment, the cover layer is an adhesive polyimide and the secondary cover layer is a thermoset polyimide, polycarbonate, or LCP. The secondary cover layer may be made of the same or different polymer material as the substrate layer. For example, they may both be thermoset polyimides, polycarbonates, or LCPs or they may be any combination of these materials. The cover layer may then be bonded to the substrate and patterned circuit, e.g., with a laminator. Any type of bonding process may be used so long as the cover layer bonds to the substrate layer, preferably forming a hermetic seal around the patterned circuit. The cover layer and/or substrate may be etched in the same manner as described above to form vias or openings. If both the substrate and cover layers are to be etched, they may be etched simultaneously in a single step if an etchant will etch both layers, preferably at the same or similar etch rates. If the etch rates are materially different, one layer will need to be etched at a time. This can be easily accomplished by flood coating a photoresist on the layer that will not be etched.

The processes described above for making the covered flexible circuits may be conducted as a batch process, using individual steps, or in automated roll-to-roll fashion, using equipment designed to transport a web material through the process sequence from a supply roll to a wind-up roll. Automated processing uses a web handling device that has a variety of processing stations for applying, exposing and developing photoresist coatings, as well as etching and plating the metallic parts, and etching the polymer film. Etching stations may include a number of spray bars with jet nozzles that spray etchant on the moving web to etch those parts of the web not protected by crosslinked photoresist. If a roll-to-roll process is used and the adhesive polyimide requires post-processing baking to cure, the inventor has found that the entire wound-up roll containing the covered flexible circuits may be placed in a bake oven. Alternatively, the web may be fed through an oven, but a long oven and/or a substantial dwell time for each section of the web would be required. Suitable drying conditions for at least one embodiment of the present invention is one hour at 185° C.

Articles of the invention may have such desirable features as a hermetic seal of the circuit layer within the substrate layer and cover layer with precisely located openings registered from both the substrate and cover layer sides. As circuits become smaller and smaller, the ability to precisely and accurately align cover layers with circuit patterns becomes more and more difficult with standard processes in which a cover layer is patterned before it is applied to a circuit. Additionally, with standard current processes, features on the substrate and circuit must be over-sized to accommodate cover layer feature misalignment. With embodiments of the present invention in which the substrate and cover layers are etched at the same time, misalignment is much less of an issue. Accordingly, the substrate and circuit features can be reduced.

Another advantage of embodiments of the present invention is that polymer etching steps may be carried out near the end of the process. In standard current processes, substrate etching occurs early. After a number of substrate features/holes are created, the web material used in a roll-to-roll process becomes weak. With polymer etching steps being carried out near the end of the process, the web remains more stable through a greater portion of the process.

Another advantage of embodiments of the present invention is that the etched cover layer can serve as a mask for plating steps, such as gold plating. While gold plating is typically done before the cover layer is applied, being able to plate after the cover layer is applied allows the use of less plating material because no allowance is needed for misregistration of the cover layer. This can result in significant cost savings, particularly if the plating material is gold. Articles of the present invention have many suitable applications. An application in which the articles of the present invention are particularly useful is inkjet printheads. Most inkjet cartridges are operated through use of a flexible circuit attached to the printhead of the ink cartridge. Because of its location, the flexible circuit comes into contact with the ink(s) being dispensed. These inks can be very corrosive to the flexible circuit, so it is highly desirable that the circuits be ink-resistant. The present invention can provide hermetically sealed flexible circuits, made with polyimide and LCP materials, which are inherently ink resistant, making them particularly well-suited for use in inkjet applications.

Another application in which the articles of the present invention are particularly useful is suspension circuits for hard disk drives. A significant amount of polymer etching may be done on a suspension circuit. If this is done in the initial manufacturing stages, the web is structurally weakened as it is passed through subsequent stages. The manufacturing process for suspension circuits is greatly benefited by the ability to delay etching of the polymer layer(s) until the end of the process, as can be done in accordance with the present invention.

Other application for which the articles of the present invention would be well-suited are biosensor, e.g., fingerprint sensor applications, microfluidic structures, and consumer electronics such as plasma and flat panel televisions, lap top computers, personal digital assistants, cell phones, and calculators.

Example

Adhesive Polyimide/Thermoset Polyimide

A sheet of ESPANEX SPC 35A/25A, having 35 μm thick adhesive polyimide layer (substrate layer) and a 25 μm thick thermoset polyimide (APICAL) layer (secondary substrate layer), available from Nippon Steel Chemical Co., Japan was laminated to a film of 35 μm thick copper foil, substrate layer side facing the copper film, using a standard laminator. The lamination was carried out at about a temperature setting of 143° C., a line speed of 0.5 cm/sec, and a pressure of 241 kPa.

To produce the circuit pattern, a dry film photoresist available under trade designation KG 2150 from Kolon Industries, Korea, was laminated onto the copper film using a standard laminator at about a temperature setting of 149° C., a line speed of 0.5 cm/sec, and a pressure of 241 kPa. The photoresist was patterned using a UV light and photomask, then developed by removal of the unexposed photoresist with a dilute aqueous solution of a 4 wt % sodium carbonate solution, at a temperature of about 24° C., until desired patterns were obtained on the copper side of the film. The exposed portions of the copper layer were then etched down to the substrate layer surface using a cupric chloride/hydrochloric etchant having a specific gravity of 1.28/mL, a conductivity of 360 mS/cm, and an oxidation reduction potential (ORP) of 515 mV, to form the desired circuit pattern. A dilute aqueous solution, containing 5 wt % alkali metal carbonate, at a temperature of about 20° C. was then used to strip the crosslinked photoresist.

A second sheet of ESPANEX SPC 35A/25A, forming the cover layer and secondary cover layer was then laminated to the existing structure with the cover layer side facing the patterned circuit. The same laminator as described above was used at a temperature setting of 149° C., a line speed of 1 foot per minute, and a pressure of 310 kPa, followed by oven baking at 185° C. for one hour. The resulting structure was the same or similar to the structure illustrated in FIG. 2D.

Next, layers of KG 2150 photoresist were laminated to each side of the structure, patterned, and developed in the same manner as described above. The exposed portions of the polyimide layers and underlying polyimide adhesive layers were then etched down to the copper circuit using an alkaline etchant of 40 wt % potassium hydroxide, 20 wt % monoethanolamine, 7 wt % ethylene glycol, and 48 wt % de-ionized water at 93° C. and 138 kPa spray pressure. A dilute aqueous solution, containing 5 wt % alkali metal carbonate, at a temperature of about 63° C. was then used to strip the crosslinked photoresist.

It will be appreciated by those of skill in the art that, in light of the present disclosure, changes may be made to the embodiments disclosed herein without departing from the sprit and scope of the present invention.

What is claimed is:

1. A method of making a flexible circuit comprising:
providing a chemically-etchable primary substrate layer comprising a polymer type selected from the group consisting of adhesive polyimides, liquid crystal polymers, polycarbonates, and thermoset polyimides;
patterning a conductive circuit on a first surface of the primary substrate layer;
bonding a first surface of an unpatterned primary cover layer comprising an adhesive polyimide polymer on the first surface of the primary substrate layer over the conductive circuit; and
patterning one or both of the primary substrate layer and primary cover layer by chemical etching;
wherein one or both of the primary substrate and primary cover layers comprise an adhesive polyimide, which is a polyamide-imide having the following repeating units:

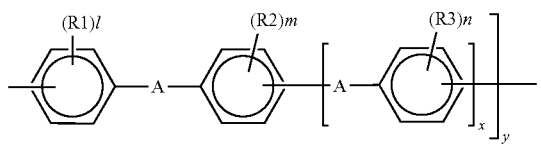

in which R represents a divalent radical, R' represents a trivalent radical, and n is an integer of at least 5.

2. The method of claim 1 wherein R is

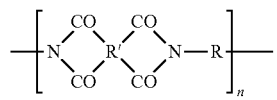

and A is —NH—CO—, R1 to R3 are alkyl, alkoxy, or halogen, either identical with or different from one another, l, m, and n are integers from 0 to 4, x is 0 or 1, and y is an integer indicating the number of repeating units and is equal to or greater than 1 and in which at least one alkoxy group is present.

3. The method of claim 1 in which R is

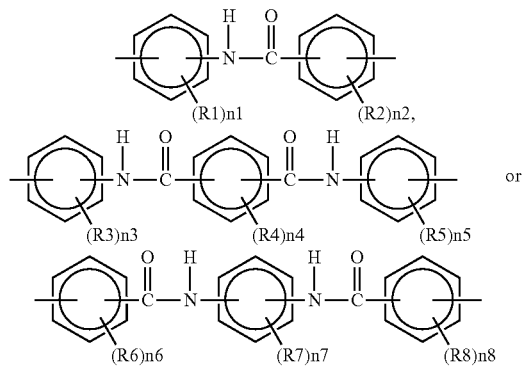

wherein R1 to R8 are independently of one another lower alkyl groups, lower alkoxy groups, or halogens, and n1 to n8 are integers of 0 to 4.

4. The method of claim 3 in which R' is

5. The method of claim 1 wherein the primary substrate is an adhesive polyimide, further comprising bonding a secondary substrate layer to a second surface of the substrate layer and patterning the secondary substrate layer, wherein the secondary substrate layer comprises a polymer type selected from the group consisting of liquid crystal polymers, polycarbonates, and thermoset polyimides.

6. The method of claim 1 further comprising bonding a secondary cover layer to a second surface of the primary cover layer and patterning the secondary cover layer wherein the secondary cover comprises a polymer type selected from the group consisting of liquid crystal polymers, polycarbonates, and thermoset polyimides.

7. The method of claim 2 wherein the secondary cover layer is patterned in the same chemical etching step as the primary cover layer.

8. The method of claim 1 further comprising bonding a secondary substrate layer to a second surface of the primary substrate layer, bonding a secondary cover layer to a second surface of the primary cover layer, and patterning one or both of the secondary substrate layer and secondary cover layer wherein the secondary substrate and cover layers independently comprises a polymer type selected from the group consisting of liquid crystal polymers, polycarbonates, and thermoset polyimides.

9. The method of claim 8 wherein the secondary substrate layer is patterned in the same chemical etching step as the primary substrate layer.

10. The method of claim 1 wherein the substrate and cover layer are patterned simultaneously.

11. The method of claim 1 wherein the substrate and cover layer are both adhesive polyimides.

12. The method of claim 1 wherein patterning the substrate and cover layer exposes portions of one or both sides of the conductive circuit layer.

13. The method of claim 1 wherein patterning at least one of the substrate and cover layers is carried out by using an aqueous alkaline etchant comprising about 30 to about 50 wt % alkali metal salt, about 10 to about 30 wt % amine, and about 5 to about 10% alcohol.

14. The method of claim 1 wherein patterning at least one of the substrate and cover layers is carried out by using an aqueous alkaline etchant comprising about 30 to about 50 wt % potassium hydroxide, about 10 to about 30 wt % monoethanolamine, and about 5 to about 10% ethylene glycol.

15. The method of claim 14 wherein patterning at least one of the substrate and cover layers is carried out by using an aqueous alkaline etchant comprising about 40 wt % potassium hydroxide, about 20 wt % monoethanolamine, and about 7% ethylene glycol.

16. The method of claim 6 wherein the flexible circuit is made using a roll-to-roll process.

17. The method of claim 16 wherein the circuits are wound in a wound-up roll and are placed in a bake oven to cure the adhesive polyimide.

18. A flexible circuit comprising:
a chemically-etchable polymeric primary substrate layer;
a patterned conductive circuit on the polymeric primary substrate layer; and
a chemically-etchable polymeric primary cover layer on at least a portion of the patterned conductive circuit and a portion of the primary substrate layer surface adjacent to the patterned conductive circuit;

wherein one or both of the primary substrate and primary cover layers comprise an adhesive polyimide polymer, which is a polyamide-imide polymer having the following repeating units:

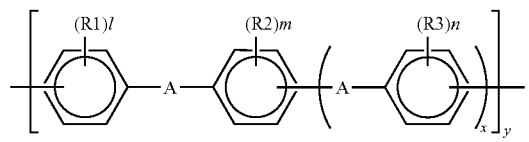

in which R represents a divalent radical, R' represents a trivalent radical, and n is an integer of at least 5.

19. The flexible circuit of claim 18 wherein R is

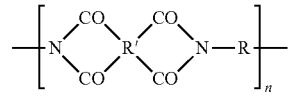

and A is —NH—CO—, R1 to R3 are alkyl, alkoxy, or halogen, either identical with or different from one another, l, m, and n are integers from 0 to 4, x is 0 or 1, and y is an integer indicating the number of repeating units and is equal to or greater than 1 and in which at least one alkoxy group is present.

20. The flexible circuit of claim 18 in which R is

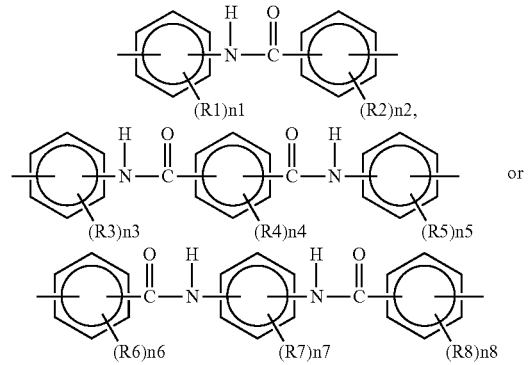

wherein R1 to R8 are, independently of one another, lower alkyl groups, lower alkoxy groups, or halogens, and n1 to n8 are integers of 0 to 4.

21. The flexible circuit of claim 20 in which R' is

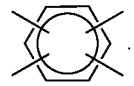

22. The flexible circuit of claim 18 wherein the primary substrate comprises an adhesive polyimide polymer, further comprising a secondary substrate layer on the surface of the primary substrate layer opposite the surface having a patterned conductive circuit thereon wherein the secondary substrate comprises a polymer type selected from the group consisting of liquid crystal polymers, polycarbonates, and thermoset polyimides.

23. The flexible circuit of claim 22 wherein the patterned conductive circuit is exposed by an opening in one or both of (a) the primary and secondary substrate layers and (b) the primary cover layer.

24. The flexible circuit of claim 18 wherein the primary cover layer comprises an adhesive polyimide polymer, further comprising a secondary cover layer on the surface of the primary cover layer opposite the surface on the patterned conductive circuit wherein the secondary cover comprises a polymer type selected from the group consisting of liquid crystal polymers, polycarbonates, and thermoset polyimides.

25. The flexible circuit of claim Previously presented 24 wherein the patterned conductive circuit is exposed by an opening in one or both of (a) the primary substrate layer and (b) the primary and secondary cover layers.

26. The flexible circuit of claim 18 wherein the primary cover layer comprises an adhesive polyimide polymer, further comprising a secondary cover layer on the surface of the primary cover layer opposite the surface on the patterned conductive circuit wherein the secondary cover layer and the primary substrate independently comprise a polymer type selected from the group consisting of liquid crystal polymers, polycarbonates, and thermoset polyimides.

27. The flexible circuit of claim 18 wherein a portion of the patterned conductive circuit is exposed through an opening in one or both of the primary substrate layer and primary cover layers.

28. The flexible circuit of claim 18 in an inkjet printhead.

29. The flexible circuit of claim 18 in a hard disk drive.

* * * * *

UNITED STATES PATENT AND TRADEMARK OFFICE
CERTIFICATE OF CORRECTION

PATENT NO.        : 8,049,112 B2
APPLICATION NO.   : 11/735167
DATED             : November 1, 2011
INVENTOR(S)       : Rui Yang It is certified that error appears in the above-identified patent and that said Letters Patent is hereby corrected as shown below:

Column 12

Lines 22-27, in Claim 2, delete " 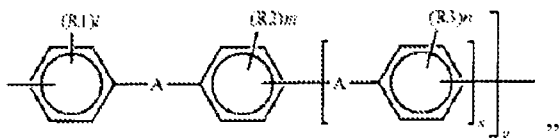 "

and insert -- 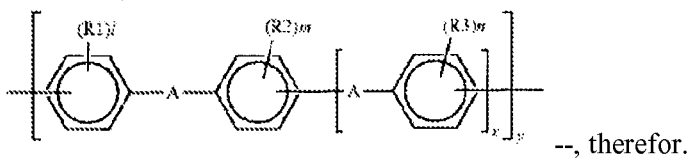 --, therefor.

Column 13
Line 11, in claim 7, delete "claim 2" and insert -- claim 6 --, therefor.
Line 53, in claim 16, delete "claim 6" and insert -- claim 1 --, therefor.

Column 15
Line 12, in claim 25, after "claim" delete "previously presented".

Signed and Sealed this
Thirty-first Day of January, 2012

David J. Kappos
*Director of the United States Patent and Trademark Office*